(12) United States Patent
Zhang et al.

(10) Patent No.: US 12,009,280 B2
(45) Date of Patent: Jun. 11, 2024

(54) IC PACKAGE WITH HEAT SPREADER

(71) Applicant: TEXAS INSTRUMENTS INCORPORATED, Dallas, TX (US)

(72) Inventors: Rongwei Zhang, Plano, TX (US); Woochan Kim, San Jose, CA (US); Patrick Francis Thompson, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 103 days.

(21) Appl. No.: 17/547,698

(22) Filed: Dec. 10, 2021

(65) Prior Publication Data

US 2023/0187306 A1    Jun. 15, 2023

(51) Int. Cl.
*H01L 23/367* (2006.01)
*H01L 21/48* (2006.01)
*H01L 23/00* (2006.01)
*H01L 25/065* (2023.01)

(52) U.S. Cl.
CPC ...... *H01L 23/3677* (2013.01); *H01L 21/4882* (2013.01); *H01L 24/48* (2013.01); *H01L 25/0655* (2013.01); *H01L 2224/48138* (2013.01); *H01L 2224/48158* (2013.01)

(58) Field of Classification Search
CPC ............... H01L 23/3677; H01L 24/48; H01L 2224/48158
See application file for complete search history.

(56) References Cited

U.S. PATENT DOCUMENTS

2019/0080990 A1* 3/2019 Kimura ............ H01L 23/49541
2021/0202357 A1* 7/2021 Poddar .................. H01L 24/45

* cited by examiner

*Primary Examiner* — Walter H Swanson
(74) *Attorney, Agent, or Firm* — Ronald O. Neerings; Frank D. Cimino

(57) ABSTRACT

An integrated circuit (IC) package includes a molding having a first surface and a second surface, the first surface opposing the second surface. An interconnect is encased in the molding. The interconnect includes pads situated at a periphery of a side of the IC package. A portion of the pads are exposed at the first surface of the molding. A die pad is situated proximal to the second surface of the molding. The die pad has a first surface and a second surface, the first surface opposing the second surface, and the second surface is circumscribed by the second surface of the molding. A die is mounted on the first surface of the die pad. A heat spreader is mounted on the second surface of the molding and the second surface of the die pad. The heat spreader extends between edges of the second surface of the molding.

24 Claims, 5 Drawing Sheets

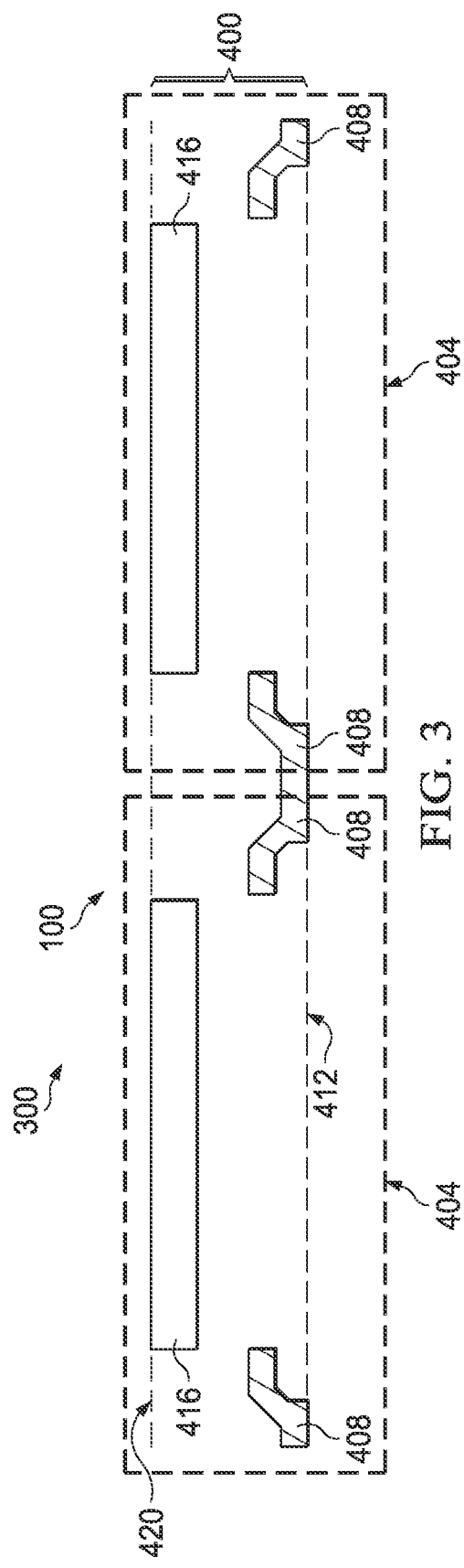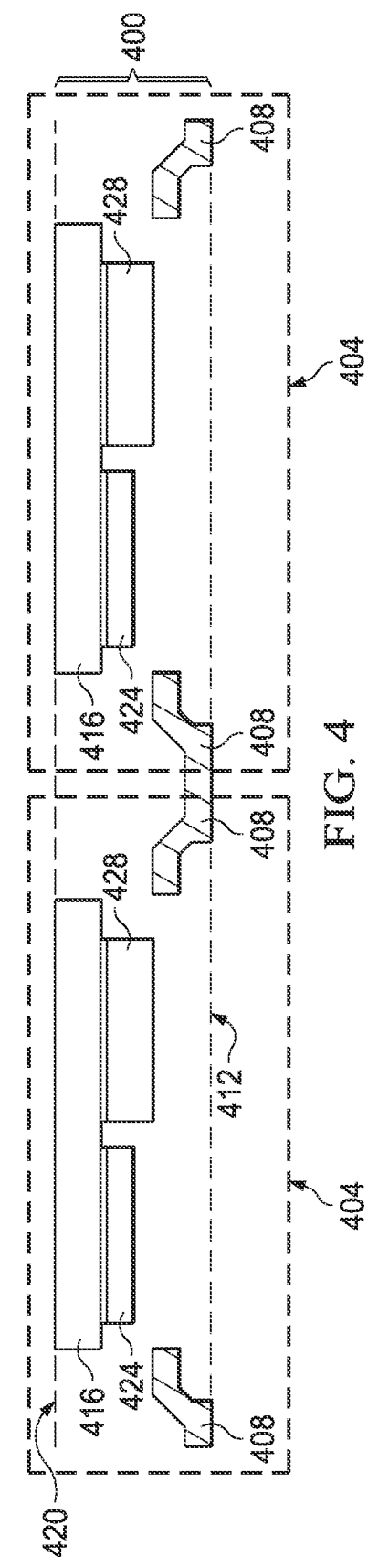

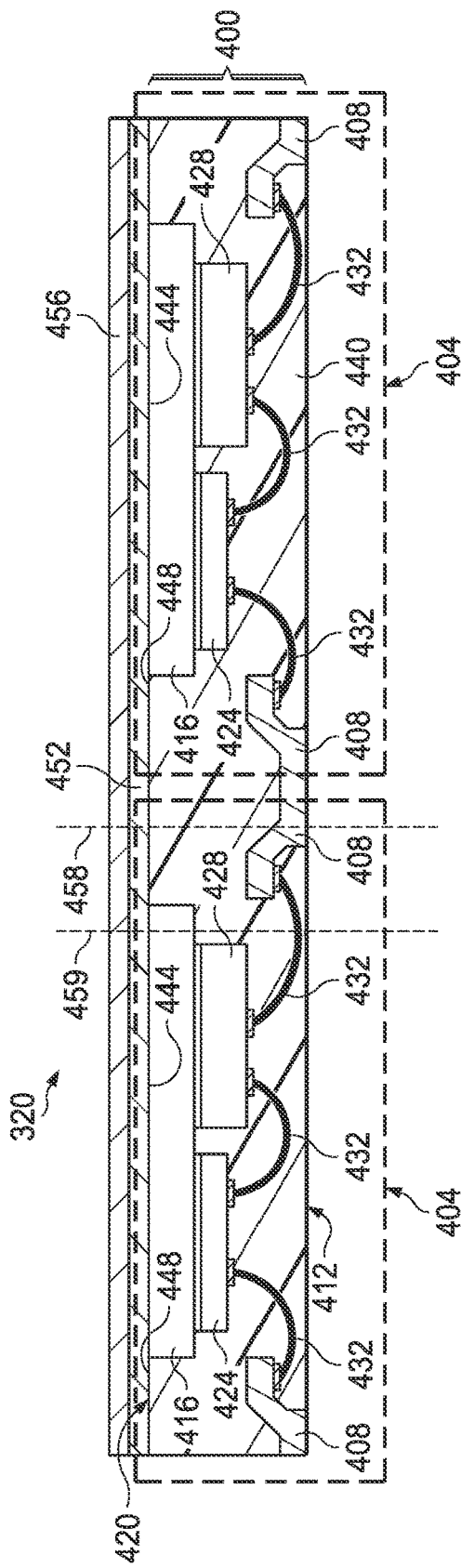
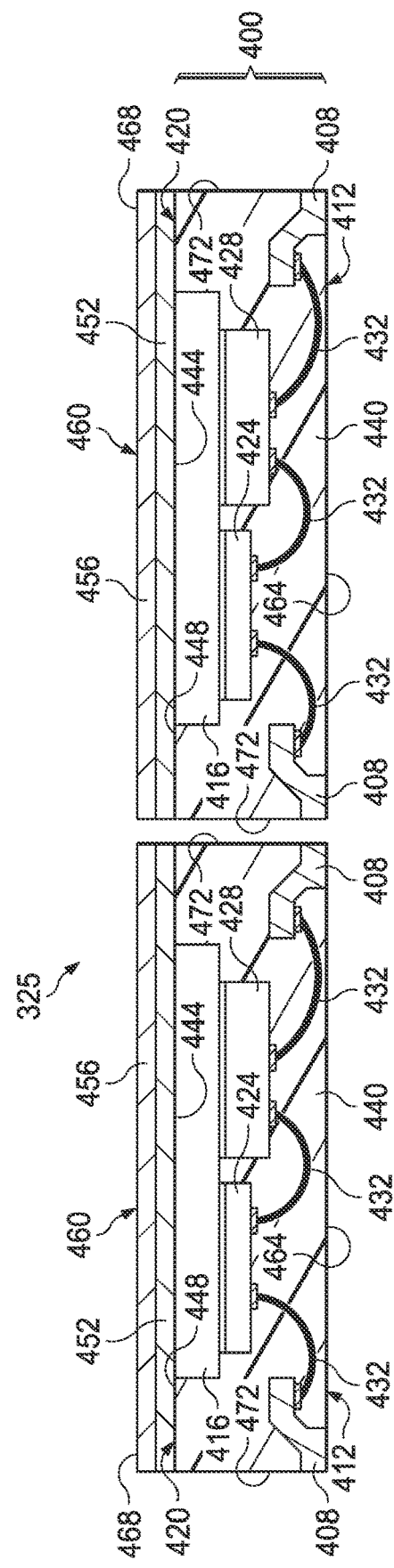
FIG. 7
FIG. 8

IC PACKAGE WITH HEAT SPREADER

TECHNICAL FIELD

This description relates to an integrated circuit (IC) package that includes a heat spreader.

BACKGROUND

A semiconductor package is a metal, plastic, glass, or ceramic casing containing one or more discrete semiconductor devices or integrated circuits. Individual components are fabricated on semiconductor wafers (commonly silicon) before being diced into die, tested, and packaged. The package provides conductive members (e.g., leads) that enable connecting to an external environment, such as a printed circuit board (PCB). Moreover, the package provides protection against threats such as mechanical impact, chemical contamination, and unintended light exposure. Also, the package facilitates the dissipation of heat produced by the device, with or without the aid of a heat spreader. There are thousands of package types in use.

Some semiconductor packages, such as integrated circuit (IC) chips are molded out of an epoxy plastic that provides adequate protection of the semiconductor devices, and mechanical strength to support the connections (e.g., leads) and handling of the semiconductor package.

SUMMARY

A first example relates to an integrated circuit (IC) package. The IC package includes a molding having a first surface and a second surface, the first surface opposing the second surface. An interconnect is encased in the molding. The interconnect includes pads situated at a periphery of a first surface of the IC package. A portion of the pads are exposed at the first surface of the molding. A die pad is situated proximal to the second surface of the molding. The die pad has a first surface and a second surface, the first surface opposing the second surface, and the second surface is circumscribed by the second surface of the molding. A die is mounted on the first surface of the die pad. A heat spreader is mounted on the second surface of the molding and the second surface of the die pad. The heat spreader extends between edges of the second surface of the molding, and the heat spreader provides a second surface of the IC package.

A second example relates to a method for forming IC packages. The method includes encasing a sheet of interconnects and dies in a molding having a first surface and a second surface, the molding has a plurality of units. The units include pads situated at a periphery of a first side of a respective unit. A portion of the pads are exposed at the first surface of the molding. The units also include a die pad having a first surface and a second surface, the first surface opposing the second surface, and the second surface is circumscribed by the second surface of the molding. A respective die of the dies is mounted on the first surface of the die pad. The method also includes mounting a heat spreader on the second surface of the molding. The heat spreader forms a continuous surface that extends between edges of the second surface of the molding. The method includes singulating the units of the sheet of interconnects into IC packages.

BRIEF DESCRIPTION OF THE DRAWINGS

FIG. 3 illustrates a first stage of an example method for forming IC packages.

FIG. 4 illustrates a second stage of the example method for forming the IC packages.

FIG. 7 illustrates a fifth stage of the example method for forming the IC packages.

FIG. 8 illustrates a sixth stage of the example method for forming the IC packages.

DETAILED DESCRIPTION

This description relates to an integrated circuit (IC) package with a heat spreader, and a method for fabricating the IC package. The IC package includes a molding having a first surface and a second surface, the first surface opposing the second surface. An interconnect is encased in the molding. The interconnect has pads situated at a periphery of a first side of the IC package, and a surface of the pads are exposed at the first surface of the molding. A die pad is situated proximal to the second surface of the molding. That is, the die pad and the pads are situated on opposing sides of the molding. The die pad has opposing surfaces, namely a first surface and a second surface. The second surface of the die pad is circumscribed by the second surface of the molding, such that the second surface of the molding does not cover the second surface of the die pad. A die (or multiple dies) is mounted on the first surface of the die pad.

The heat spreader is mounted on the second surface of the molding and the second surface of the die pad with a layer of adhesive material. The heat spreader extends between edges of the second surface of the molding. Stated differently, the heat spreader covers the entire surface formed by the second surface of the die pad and the second surface of the molding. Accordingly, during operation, the heat generated in the die is transferred to the die pad, and this heat is in turned transferred to the heat spreader through the layer of adhesive material. Because the heat spreader is adhered to the die pad during packaging, gaps between the heat spreader and the surface formed by the second surface of the molding and the second surface of the die pad are curtailed, thereby lowering a thermal resistance and increasing thermal transfer between the die pad and the heat spreader.

Figure 1:
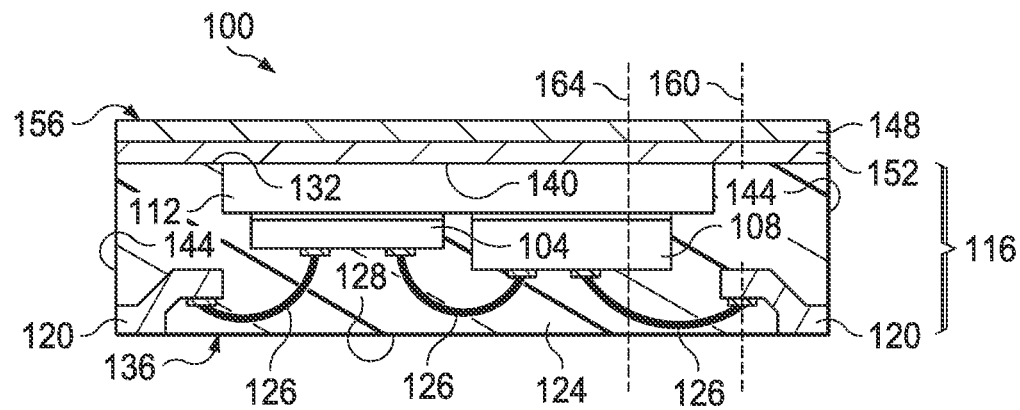
FIG. 1 illustrates a diagram of a cross-sectional view of an example of an integrated circuit (IC) package with a heat spreader.

FIG. 1 illustrates a cross-section of an IC package 100. The IC package 100 is employable as a high voltage device, such as a power converter (e.g., a direct current (DC)-to-DC power converter, an alternating current (AC)-to-DC power converter or a DC-to-AC power converter (alternatively referred to as an inverter). In other examples, the IC package 100 implements other types of devices.

The IC package 100 includes a first die 104 and a second die 108. In other examples, the IC package 100 has a single die. In still other examples, the IC package 100 has more than two (2) dies. The first die 104 and the second die 108 are mounted on a die pad 112 of an interconnect 116. The first die 104 and the second die 108 are spaced apart. The interconnect 116 also includes pads 120 that are arranged at a periphery of the IC package 100. The first die 104, the second die 108 and the interconnect 116 are encased in a molding 124 (e.g., a molding compound) that has a first surface 128 and a second surface 132, with the second surface 132 opposing the first surface 128. In some examples, the molding 124 is formed of plastic. In various examples, the IC package is a quad flat no leads (QFN) package or a dual flat no leads (DFN) package.

In some examples, the IC package 100 is referred to as a top side package. That is, the die pad 112 is proximal to the second surface 132 of the molding 124, and on an opposing side (e.g., a top side) on the molding 124 from the pads 120. Accordingly, wire bonds 126 electrically couple the first die 104 to the second die 108. The wire bonds 126 also electrically couple the first die 104 and the second die 108 to the pads 120.

The pads 120 are situated proximal to the first surface 128 of the molding 124. Moreover, a portion of the pads 120 is exposed for mounting the IC package 100 on a printed circuit board (PCB) or other substrate. A combination of the first surface 128 and the exposed region of the pads 120 forms a first surface 136 of the IC package 100.

A region of the die pad 112 is circumscribed by the second surface 132 of the molding 124. Thus, a combination of the second surface 132 of the molding 124 and the die pad 112 provides a continuous surface 140 for adding additional layers. In some examples, this surface 140 is roughened to improve adhesive properties.

The die pad 112 does not overhang the pads 120. More particularly, the die pad 112 extends from a center of the IC package 100 towards edges 144 of the molding 124, and the pads 120 are situated to intersect with the edges 144 of the molding 124 and extend toward the center of the IC package 100. However, neither the pads 120 nor the die pad 112 extend sufficiently to overlap because the size of the die pad 112 is limited by the size of the pads 120 (and vise versa). Accordingly, there is no plane perpendicular to the first surface 128 and the second surface 132 of the molding 124 that would cross through both the die pad 112 and the pads 120.

The IC package 100 includes a heat spreader 148 mounted on the surface 140. The heat spreader 148 is implemented with a thermally conductive material, such as a copper sheet or copper sheet with noble plating such as nickel-palladium-gold (NiPdAu) plating or silver (Ag) plating. In some examples, a layer of adhesive material 152 is sandwiched between the heat spreader 148 and the surface 140. The adhesive material 152 is a thermally conductive adhesive, such as an epoxy adhesive with a thermally conductive filler material, or a sintering paste formed of silver or copper.

The heat spreader 148 and the adhesive material 152 extends between the edges 144 of the molding 124. Moreover, a second surface 156 (e.g., a top surface) of the IC package 100 is formed with a surface of the heat spreader 148.

As a reference of the architecture of the IC package 100, a first plane 160 and a second plane 164 are illustrated, wherein both the first plane 160 and the second plane 164 are imaginary planes. The first plane 160 and the second plane 164 both extend perpendicular to the first surface 128 and the second surface 132 of the molding 124. Additionally, the first plane 160 and the second plane 164 are parallel planes. As illustrated, the first plane 160 extends through a particular pad 120 and through the heat spreader 148, but not through the die pad 112. Conversely, the second plane 164 extends through the die pad 112 and the heat spreader 148 but not through any of the pads 120.

In some examples, the first die 104 has a first supply voltage and the second die 108 has a second supply voltage different from the first supply voltage. For instance, in at least one example, the IC package 100 is implemented in a power converter. In such a situation, the first die 104 is implemented as a controller that operates at a relatively low voltage level (e.g., 12 volts (V) or less). Continuing with this example, the second die 108 is implemented as a power transistor die that includes high power devices, such as field effect transistor (FETs) that are rated for high voltages (e.g., 50 V or more). In such examples, the second die 108 generates a considerable amount of heat that needs to be dissipated. To facilitate this heat dissipation, the second surface 156 (formed by the surface of the heat spreader 148) of the IC package is an uninterrupted, continuous surface. Moreover, the second surface 156 provides a surface for mounting a heat sink.

Figure 2:
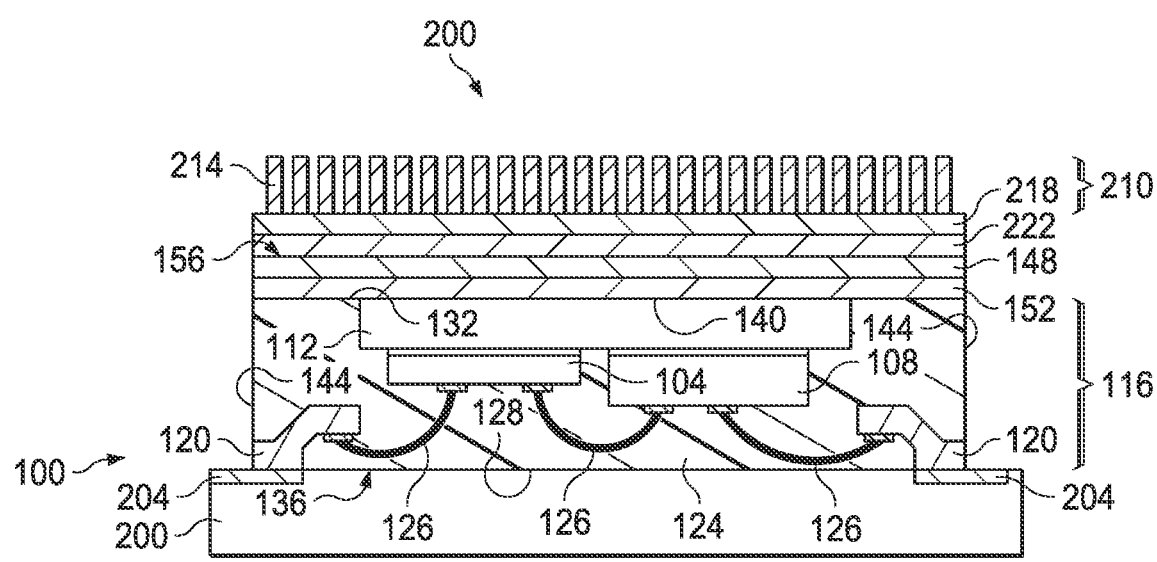
FIG. 2 illustrates the IC package of FIG. 1 mounted on a printed circuit board.

FIG. 2 illustrates an example of the IC package 100 of FIG. 1 mounted (e.g., installed) on a PCB 200. Accordingly, FIGS. 1 and 2 employ the same reference numbers to denote the same structures. The IC package 100 is mounted such that the pads 120 contact traces 204 integrated with the PCB 200. Accordingly, the first surface 136 of the IC package 100 faces the PCB 200.

A heat sink 210 is mounted on the second surface 156 of the IC package 100. In some examples, the heat sink 210 is formed as a castellated structure with fingers 214 (only one of which is labeled) that extend from a plate 218. In some examples, the plate 218 extends over an entirety (or nearly the entirety) of the second surface 156 of the IC package. The heat sink 210 is adhered to the second surface 156 of the IC package 100 with a thermally conductive adhesive 222.

During operation, the heat generated in the first die 104 and the second die 108 is transferred to the die pad 112. Heat is transferred from the die pad 112 to the heat spreader 148 through the adhesive material 152. Because the heat spreader 148 is adhered to the die pad 112 during packaging, such that the heat spreader 148 is a constituent component of the IC package 100, gaps between the surface 140 (formed with the second surface 132 of the molding 124 and a region of the die pad 112) are curtailed, thereby lowering a thermal resistance and increasing thermal transfer between the die pad 112 and the heat spreader 148.

Also, heat is transferred between the heat spreader 148 and the heat sink 210 through the thermally conductive adhesive 222. As illustrated, both the heat spreader 148 and the heat sink 210 extend between the edges 144 of the molding 124. Accordingly gaps between the heat spreader 148 and the heat sink 210 are curtailed, thereby lowering a thermal resistance between the heat spreader 148 and the heat sink 210. Lowering this thermal resistance provides for greater thermal transfer between the heat spreader 148 and the heat sink 210 as compared to a conventional approach where a heat spreader does not extend between edges of an IC package. More generally, the heat spreader 148 has a surface area that is up to about 225% larger than a conventional heat spreader that extends only to edges of a die pad. Unless otherwise stated, in this description, 'about' preceding a value means+/−10 percent of the stated value. As a specific example, suppose that a quad flat no-leads (QFN) package has an area of 12 millimeters (mm) by 12 mm (144 mm total area), and has a die pad size of 7.7 mm by 8.3 mm (63.91 mm total area). In this situation, the heat spreader 148 has a surface area of about 144 mm, which is about 225% larger than the area of the die pad (63.91 mm).

As illustrated in FIG. 2, implementing the IC package 100 enables for efficient heat dissipation of heat generated by the first die 104 and the second die 108. As noted, in some examples, the second die 108 is a high power die that is driven with a supply voltage of 50 V or more. In such examples, efficient heat dissipation is needed to ensure adequate performance of the IC package 100. The architecture of the interconnect 116 allows the heat spreader 148 to extend between the edges 144 to curtail gaps between the heat spreader 148 of the IC package 100 and the heat sink 210. Accordingly, the thermal resistance between components of the IC package 100 is lowered, such that thermal conductivity between the IC package 100 and the heat sink 210 is increased.

Further, by reducing the thermal resistance, and increasing thermal conductivity, a footprint on the PCB 200 of the IC package 100 and the heat sink 210 is reduced. More particularly, as compared to a system with a higher thermal resistance, and a lower thermal conductivity the IC package 100 and the heat sink 210 has a smaller area for the same amount of heat dissipation. Thus, the overall footprint of the combination of the IC package 100 and the heat sink 210 is reduced.

FIGS. 3-7 illustrate an example method for fabricating IC packages, such as instances of the IC package 100 of FIG. 1. Thus, for purposes of simplification of explanation, FIGS. 3-7 employ the same reference numbers to denote the same structures.

As illustrated in FIG. 3, at 300, a sheet of interconnects 400 (e.g., lead frames) are provided. The sheet of interconnects 400 includes units 404 that are singulatable into individual interconnects. The units 404 include pads 408 that are situated on a first side 412 of the sheet of interconnects 400. The units 404 also include die pads 416 that are situated on a second side 420 of the sheet of interconnects 400, the first side 412 opposing the second side 420.

Figure 5:
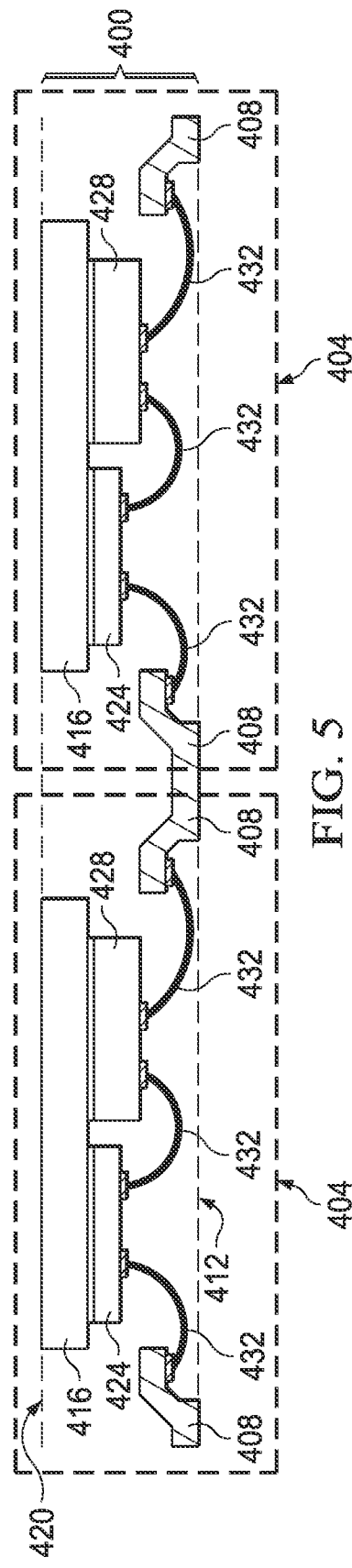
FIG. 5 illustrates a third stage of the example method for forming the IC packages.

As illustrated in FIG. 4, at 305, a first die 424 and a second die 428 are mounted on the die pads 416 of the units 404. More specifically, each unit 404 includes a first die 424 and a second die 428 mounted on a respective die pad 416. The first die 424 and the second die 428 are spaced apart. Additionally, in other examples, more or less dies are mounted on the die pads 416. As illustrated in FIG. 5, at 310, wire bonds 432 are attached to the units 404 to electrically couple the first die 424 to the second die 428. Additionally, the wire bonds 432 electrically couple the first die 424 and the second die 428 to the pads 408.

Figure 6:
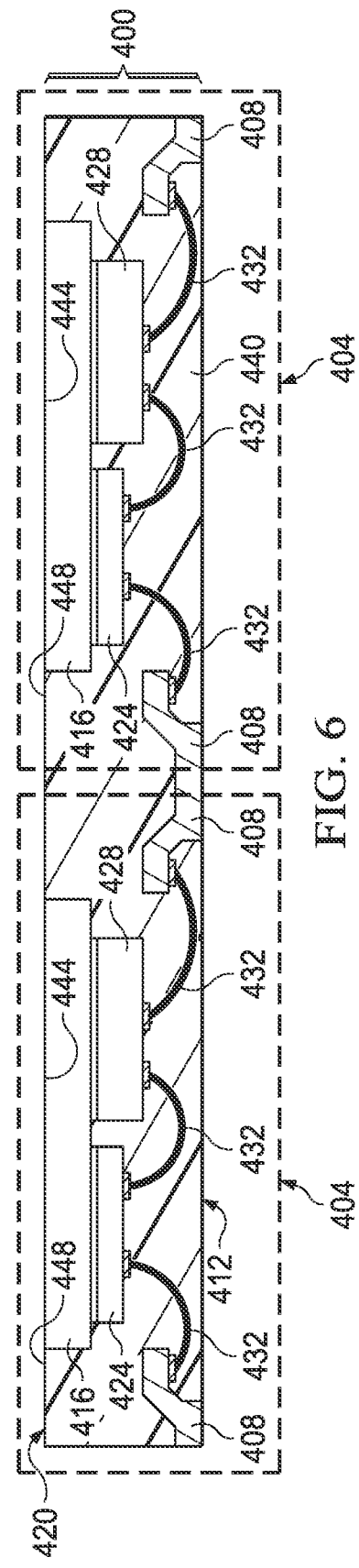
FIG. 6 illustrates a fourth stage of the example method for forming the IC packages.

As illustrated in FIG. 6, at 315, the sheet of interconnects 400 is encased in a molding 440. The molding 440 is formed with a molding compound, such as epoxy. The molding 440 is deposited such that portions of the pads 408 are exposed to allow the pads 408 to be electrically coupled to external devices. The molding 440 is also deposited such that a surface 444 of the die pads 416 on the second side of the sheet of interconnects 400 are exposed and is circumscribed by the molding 440. Also, at 315, a surface 448 of the molding and the second side 420 of the sheet of interconnects 400 is roughened with a plasma treatment (or other operation) to enhance bonding between the molding 440 (a molding compound), and the die pad 416 and a layer of an adhesive material (not shown in FIG. 6).

As illustrated in FIG. 7, at 320, the layer of adhesive material 452 is deposited on the combined surface formed of the surface 448 of the molding 440 and the second side 420 of the sheet of interconnects 400. The layer of adhesive material 452 is a thermally conductive adhesive. In various examples, the adhesive material 452 is an epoxy adhesive, or a sintering paste, such as a silver sintering paste or a copper sintering paste. In examples where sintering pastes are employed, during a sintering process, external pressure is appliable on the heat spreader 456 (such as a copper sheet or a copper sheet with noble plating such as nickel-palladium-gold (NiPdAu) or silver (Ag) plating) to facilitate the sintering between the sintering paste and the heat spreader 546, and between the sintering paste and die pad 416. Also, at 320 a heat spreader 456 formed of a sheet of thermally conductive material, such as copper or graphite is mounted on the adhesive material 452. The resultant structure is cured (heated) to secure the heat spreader 456 to the adhesive material 452. Accordingly, the resultant structure is formed such that a first plane 458 (an imaginary plane) extends through the pad 408 of the sheet of interconnects 400 and through the heat spreader 456. However, the first plane 458 does not traverse any of the die pads 416. Conversely, a second plane 459 parallel to the first plane 458 extends through a die pad 416 of the sheet of interconnects 400 and the heat spreader 456, but not through any of the die pads 416.

As illustrated in FIG. 8, at 325, the units 404 of the sheet of interconnects 400 are singulated to form individual IC packages 460. In various examples, the units 404 are singulated with sawing, plasma cutting, stretching and/or bending. The IC packages 460 have a first surface 464 that includes the pads 408 and a second surface 468 formed with the heat spreader 456. The first surface 464 opposes the second surface 468. The molding 440 includes edges 472 that are perpendicular to the first surface 464 and the second surface 468. Each of the IC packages 460 is employable to implement an instance of the IC package 100 of FIG. 1. Accordingly, in various examples, the IC packages 460 are QFN packages or DFN packages. The IC packages 460 are mountable on PCBs (e.g., the PCB 200 of FIG. 2).

As noted with respect to FIG. 1, by fabricating the IC packages 460 such that the heat spreader 456 extends between edges 472 of the molding 440 on each IC package 460, thermal resistance between the die pads 416 and the heat spreader 456 is decreased. Reducing this thermal resistance increases thermal conductivity between the die pads 416 and the heat spreader 456 to enable improved thermal dissipation of heat generated by the first die 424 and the second die 428. Accordingly, a footprint of each IC package 460 is reducible to allow for an increased number of IC packages 460 to be fabricated for the same size of sheet of interconnects 400.

Figure 9:
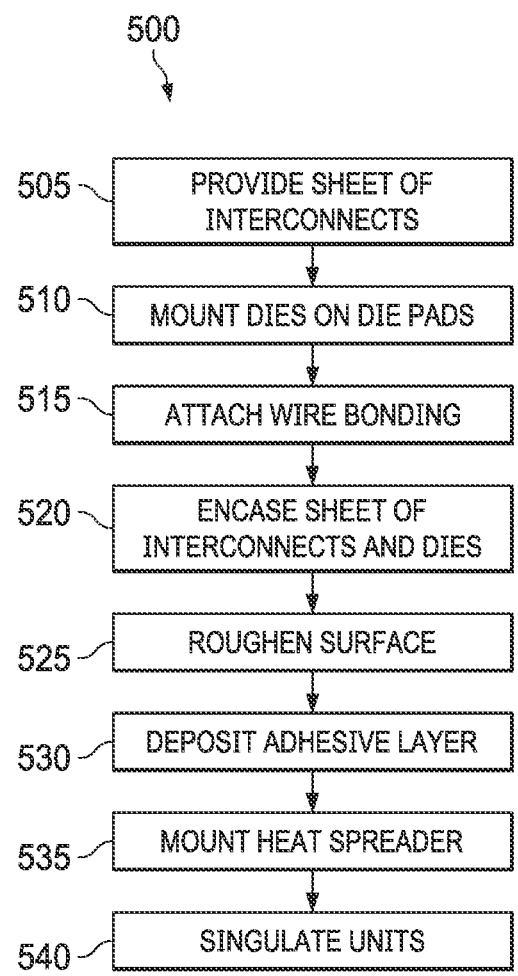
FIG. 9 illustrates a flowchart of an example method for forming IC packages.

FIG. 9 illustrates a flowchart of an example method 500 for forming IC packages. At 505, a sheet of interconnects (e.g., the sheet of interconnects 400 of FIG. 3) is provided. The sheet of interconnects includes a first side with pads (e.g., the pads 120 of FIG. 1) and a second side with die pads (e.g., the die pad 112 of FIG. 1). The sheet of interconnects includes units (e.g., the units 404 of FIG. 3) singulatable for individual IC packages. At 510, dies (e.g., the first die 104 and the second die 108) are mounted on the die pads. At 515, wire bonding (e.g., the wire bonds 126 of FIG. 1) are attached on the dies to electrically couple the dies and the pads.

At 520, the sheet of interconnects and the dies are encased in a molding. The resultant structure is formed such that a surface of the die pads are exposed in a surface of the molding. At 525, the surface of the die pads and the surface of the molding are roughened (e.g., with plasma treatment) to enhance bonding. In some examples, this plasma treatment removes a mold release agent (such as wax) on the surface of the molding (e.g., a molding compound), increases surface roughness, and introduces chemically reactive groups (such as carboxylic acid group), which enhance the adhesion between a surface formed by the molding (e.g., a mold compound) and the die pads and thermally conductive material. At 530, the thermally conductive adhesive material (e.g., the adhesive material 152 of FIG. 1) is deposited on the resultant structure to cover the surface of the molding and the exposed die pads. At 535, a heat spreader (e.g., the heat spreader 148 of FIG. 1) is mounted on the second surface of the molding and the exposed die pads. The heat spreader forms a continuous surface that extends between edges of the second surface of the molding. At 540, the units of the sheet of interconnects are singulated to form individual IC packages (e.g., an instance of the IC package 100 of FIG. 1).

Modifications are possible in the described embodiments, and other embodiments are possible, within the scope of the claims.

What is claimed is:

1. An integrated circuit (IC) package comprising:
    a molding having a first surface and a second surface, the first surface opposing the second surface;
    an interconnect encased in the molding, the interconnect comprising:
        pads situated at a periphery of a first surface of the IC package, wherein a portion of the pads are exposed at the first surface of the molding; and
        a die pad situated proximal to the second surface of the molding, the die pad having a first surface and a second surface, the first surface opposing the second surface, and the second surface is circumscribed by the second surface of the molding;
    a die mounted on the first surface of the die pad; and
    a heat spreader mounted on the second surface of the molding and the second surface of the die pad, wherein the heat spreader extends between edges of the second surface of the molding, and the heat spreader provides a second surface of the IC package.

2. The IC package of claim 1, wherein the die is a first die, and the IC package comprises a second die mounted on the first surface of the die pad.

3. The IC package of claim 2, wherein the first die and the second die are spaced apart.

4. The IC package of claim 2, wherein the first die has a first supply voltage, and the second die has a second supply voltage, greater than the first supply voltage.

5. The IC package of claim 4, wherein wire bonds electrically couple the first die to the second die.

6. The IC package of claim 5, wherein the wire bonds electrically couple the first die and the second die to the pads of the interconnect.

7. The IC package of claim 1, wherein a plane perpendicular to the second surface and the first surface of the molding crosses the heat spreader and a pad of the pads of the interconnect.

8. The IC package of claim 7, wherein a heat sink is mountable on the heat spreader.

9. The IC package of claim 1, wherein the IC package is a quad flat no leads (QFN) package.

10. The IC package of claim 1, wherein the heat spreader extends to the edges of the second surface of the molding.

11. The IC package of claim 1, further including a heat sink mounted on the heat spreader.

12. The IC package of claim 11, wherein the heat sink is a castellated structure.

13. The IC package of claim 1, further including traces of a printed circuit board electrically connected to the pads situated at the periphery of the first surface of the IC package.

14. An apparatus comprising:
    an integrated circuit (IC) package comprising:
        a molding having a first surface and a second surface, the first surface opposing the second surface;
        an interconnect encased in the molding, the interconnect comprising:
            pads situated at a periphery of a first surface of the IC package, wherein a portion of the pads are exposed at the first surface of the molding; and
            a die pad situated proximal to the second surface of the molding, the die pad having a first surface and a second surface, the first surface opposing the second surface, and the second surface is circumscribed by the second surface of the molding;
        a die mounted on the first surface of the die pad;
        a heat spreader mounted on the second surface of the molding and the second surface of the die pad, wherein the heat spreader extends between edges of the second surface of the molding, and the heat spreader provides a second surface of the IC package; and
    a printed circuit board (PCB) having traces on a surface of the PCB, at least some of the pads being electrically connected to at least some of the traces.

15. The apparatus of claim 14, wherein the IC package is a quad flat no leads (QFN) package.

16. The apparatus of claim 14, wherein the heat spreader extends to the edges of the second surface of the molding.

17. The apparatus of claim 14, further including a heat sink mounted on the heat spreader.

18. The apparatus of claim 14, wherein a plane perpendicular to the second surface and the first surface of the molding crosses the heat spreader and a pad of the pads of the interconnect.

19. The apparatus of claim 18, wherein a heat sink is mountable on the heat spreader.

20. The apparatus of claim 14, wherein the die is a first die, and the IC package comprises a second die mounted on the first surface of the die pad.

21. The apparatus of claim 20, wherein the first die and the second die are spaced apart.

22. The apparatus of claim 20, wherein the first die has a first supply voltage, and the second die has a second supply voltage, greater than the first supply voltage.

23. The apparatus of claim 22, wherein wire bonds electrically couple the first die to the second die.

24. The apparatus of claim 23, wherein the wire bonds electrically couple the first die and the second die to the pads of the interconnect.

* * * * *